(12) United States Patent
Lu

(10) Patent No.: US 10,746,179 B2
(45) Date of Patent: Aug. 18, 2020

(54) FAN DEVICE AND METHOD FOR MANUFACTURING THE SAME

(71) Applicant: Delta Electronics, Inc., Taoyuan (TW)

(72) Inventor: Chao-Wen Lu, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 190 days.

(21) Appl. No.: 15/953,182

(22) Filed: Apr. 13, 2018

(65) Prior Publication Data

US 2019/0078573 A1 Mar. 14, 2019

(30) Foreign Application Priority Data

Sep. 14, 2017 (CN) .......................... 2017 1 0828611

(51) Int. Cl.
*F04D 25/06* (2006.01)
*H05K 1/18* (2006.01)
*F04D 29/62* (2006.01)
*F04D 25/08* (2006.01)
*F04D 17/16* (2006.01)
*F04D 29/42* (2006.01)

(52) U.S. Cl.
CPC .......... *F04D 25/068* (2013.01); *F04D 17/16* (2013.01); *F04D 25/0653* (2013.01); *F04D 25/08* (2013.01); *F04D 29/424* (2013.01); *F04D 29/624* (2013.01); *H05K 1/181* (2013.01); *H05K 2201/09027* (2013.01); *H05K 2201/1003* (2013.01)

(58) Field of Classification Search
CPC ...... F04D 17/08; F04D 17/16; F04D 25/0653; F04D 25/068; F04D 25/08; F04D 29/4233; F04D 29/424; F04D 29/624; F04D 29/626; G01F 1/203; H05K 1/181; H05K 7/20136; H05K 2201/09027; H05K 2201/1003
See application file for complete search history.

(56) References Cited

U.S. PATENT DOCUMENTS

| 7,114,977 | B2 * | 10/2006 | Lei ....................... H01R 13/447 439/342 |
| 7,903,406 | B2 * | 3/2011 | Takemoto ............. F04D 17/162 361/695 |
| 8,109,713 | B2 * | 2/2012 | Horng ................. F04D 25/0613 165/121 |
| 9,074,603 | B2 * | 7/2015 | Wu ......................... F04D 17/16 |
| 9,732,757 | B2 * | 8/2017 | Lee ....................... F04D 29/646 |
| 2007/0020085 | A1 * | 1/2007 | Takemoto ............. F04D 17/162 415/93 |
| 2013/0121830 | A1 * | 5/2013 | Lee ....................... F04D 29/646 416/174 |

* cited by examiner

*Primary Examiner* — Patrick Hamo
*Assistant Examiner* — Joseph S. Herrmann
(74) *Attorney, Agent, or Firm* — Muncy, Geissler, Olds & Lowe, PC

(57) ABSTRACT

A fan device is provided, including a housing, a circuit board, a plurality of driving coils, at least one magnetic member, and a metal member. The housing includes a first surface, a second surface corresponding to the first surface, and a hollow protruding portion protruding from the first surface. The circuit board is disposed on the first surface, and the driving coils are disposed on the circuit board. The magnetic member is disposed corresponding to the driving coils. The metal member is disposed on the second surface and corresponds to the magnetic member. A method for manufacturing the fan device is also provided.

20 Claims, 6 Drawing Sheets

FAN DEVICE AND METHOD FOR MANUFACTURING THE SAME

CROSS REFERENCE TO RELATED APPLICATIONS

The present application is based on, and claims priority from, China Patent Application No. 201710828611.9, filed on Sep. 14, 2017, the disclosure of which is hereby incorporated by reference herein in its entirety.

BACKGROUND OF THE INVENTION

Field of the Invention

The application relates in general to a fan device, and in particular, to a slim-type fan device having a metal member.

Description of the Related Art

With the developmental trend of electronic devices that promise high performance, low weight, and reduced thickness, the operating temperatures of electronic devices have become increasingly higher. It is hard for heat to be dissipated from the aforementioned electronic device, therefore causing instability and other adverse effects on product reliability. Accordingly, the present electronic devices usually comprise fans as heat dissipation devices.

The centrifugal fan is one of the most common dissipation devices. The air in the electronic device can be introduced into the centrifugal fan through air inlets on the top surface and/or the bottom surface of the housing, and then exhausted though the air outlet on the lateral surface, so as to take out the heat.

In the assembly of the aforementioned fan, the silicon steel sheet and the circuit board are usually attached by glue. However, since the structure of the electronic device and the fan has become miniaturized, the amount of glue applied is hard to be controlled. If excessive amount of glue is used in the assembly, the members in the electronic device may be inclined or interfered after the glue is harden, and the overall thickness of the fan is increased. Therefore, how to address the aforementioned problem has become an important issue.

BRIEF SUMMARY OF INVENTION

To address the deficiencies of conventional products, an embodiment of the invention provides a fan device, including a housing, a circuit board, a plurality of driving coils, at least one magnetic member, and a metal member. The housing includes a first surface, a second surface corresponding to the first surface, and a hollow protruding portion protruding from the first surface. The circuit board is disposed on the first surface, and the driving coils are disposed on the circuit board. The magnetic member is disposed corresponding to the driving coils. The metal member is disposed on the second surface and corresponds to the magnetic member.

In some embodiments, a portion of the metal member is exposed from the first surface.

In some embodiments, the housing further comprises a bottom plate and at least one bridging member, and the bridging member is connected between the bottom plate and the hollow protruding portion.

In some embodiments, the housing further comprises a depression portion formed on the bottom plate, and the metal member is disposed in the depression portion.

In some embodiments, the appearance of the depression portion corresponds to the appearance of the metal member.

In some embodiments, the depression portion has a positioning structure corresponding to the metal member.

In some embodiments, a surface of the metal member is aligned with a bottom surface of the bottom plate.

In some embodiments, a portion of the circuit board is disposed between the bottom plate and the bridging member.

In some embodiments, the circuit board surrounds the bridging member and the hollow protruding portion.

In some embodiments, the circuit board has at least one recess, and the appearance of the recess corresponds to the appearance of the bridging member.

In some embodiments, the bridging member is disposed between the driving coils.

In some embodiments, the bottom plate, the bridging member, and the hollow protruding portion are integrally formed in one piece.

In some embodiments, the driving coils are arranged at equal intervals.

In some embodiments, the fan device further comprises a rotor and a blade module. The rotor is disposed in the hollow protruding portion, and the blade module is connected to the rotor. The magnetic member is disposed on the blade module.

In some embodiments, a portion of the circuit board is disposed between the metal member and the blade module.

An embodiment of the invention further provides a method for manufacturing a fan device, comprising steps of: providing a housing, wherein the housing comprises a first surface, a second surface, and a hollow protruding portion, the first surface corresponds to the second surface, and the hollow protruding portion protrudes from the first surface; disposing a circuit board on the first surface, wherein a plurality of driving coils are disposed on the circuit board; disposing at least one magnetic member corresponding to the driving coils; and disposing a metal member corresponding to the magnetic member on the second surface.

In some embodiments, the housing further comprises a bottom plate and at least one bridging member, and the bridging member is connected between the bottom plate and the hollow protruding portion.

In some embodiments, the housing further comprises a depression portion formed on the bottom plate, and the metal member is disposed in the depression portion.

In some embodiments, the method further comprises a step of deforming the bridging member by thermal melting or crimping after the step of disposing the circuit board on the first surface, so as to dispose a portion of the circuit board between the bottom plate and the bridging member.

In some embodiments, the metal member is disposed on the second surface by insert molding.

In some embodiments, a portion of the metal member is exposed from the first surface.

In some embodiments, the step of disposing the magnetic member corresponding to the driving coils comprises steps of: disposing a rotor in the hollow protruding portion; and connecting a blade module to the rotor, wherein the magnetic member is disposed on the blade module.

Owing to the structures of the bottom plate of the housing, the bridging member, and the hollow protruding portion, the circuit board and the metal member can respectively be affixed to the opposite surfaces of the housing without glue. The assembling time and the thickness of the fan device can be reduced, and the inclination of the members due to the glue can be completely avoided.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The embodiments of the fan device are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood to one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

Figure 1:
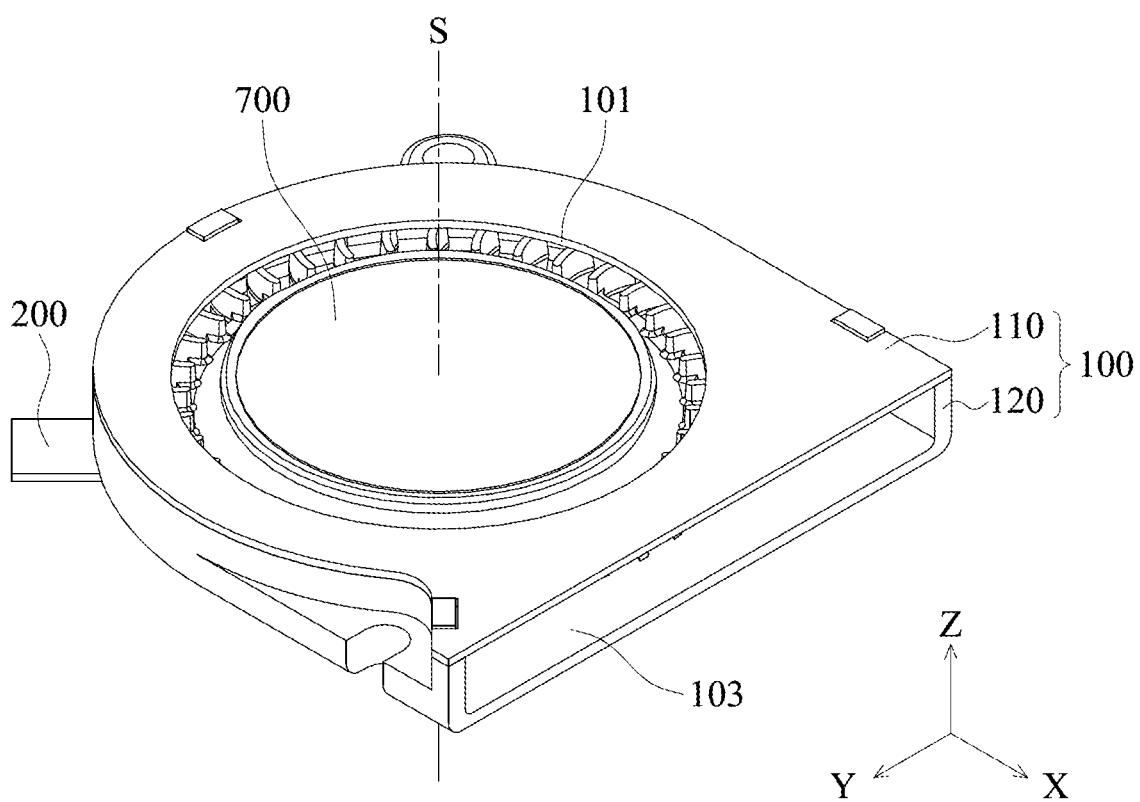
FIG. 1 is a schematic diagram of a fan device according to an embodiment of the invention.
Figure 2:
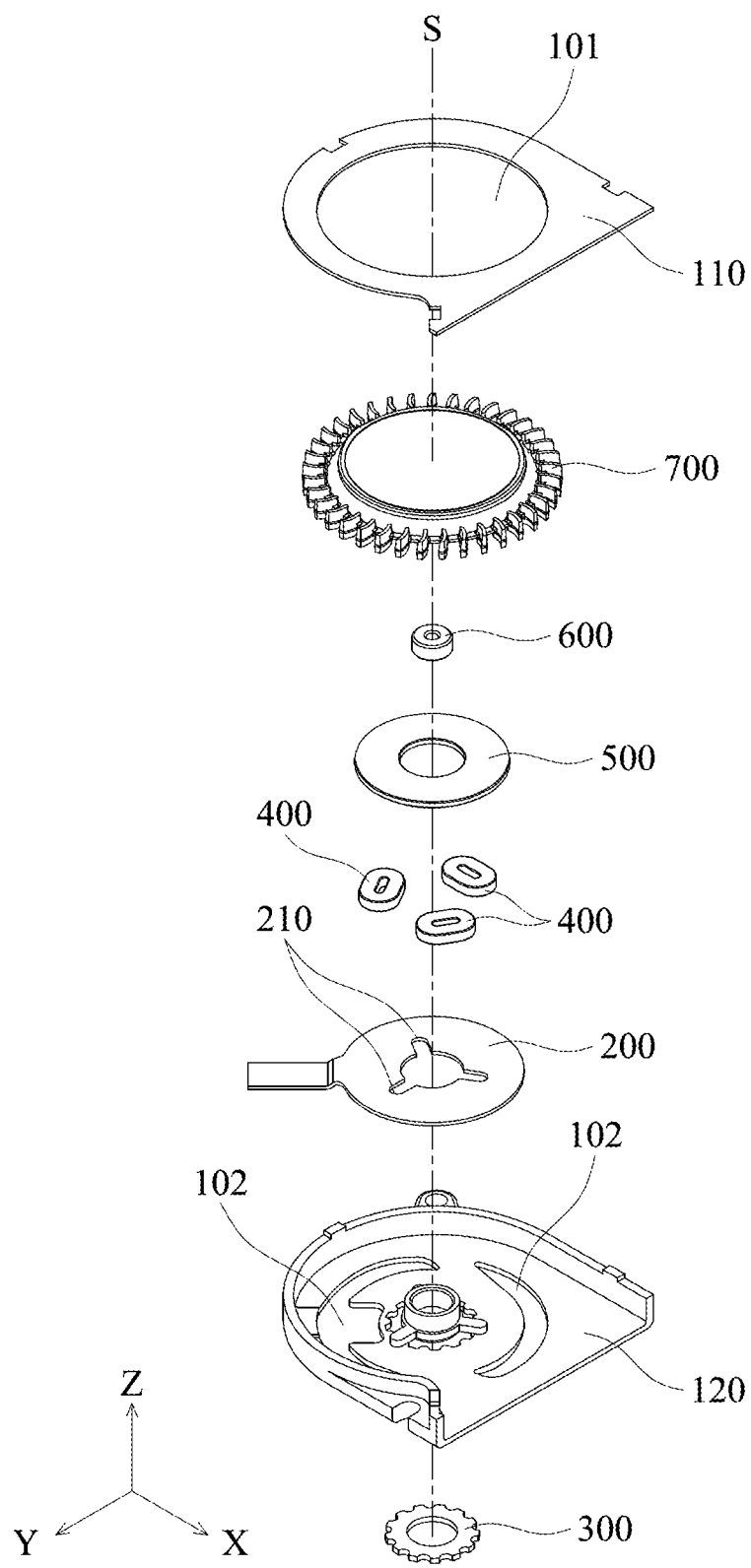
FIG. 2 is an exploded-view diagram of the fan device in FIG. 1.

FIG. 1 is a schematic diagram of a fan device according to an embodiment of the invention, and FIG. 2 is an exploded-view diagram of the fan device in FIG. 1. Referring to FIGS. 1 and 2, the fan device primarily comprises a housing 100, a circuit board 200, a metal member 300, a plurality of driving coils 400, at least one magnetic member 500, a rotor 600, and a blade module 700. When the fan device operates, the blade module 700 can rotate around a rotation axis S, so as to introduce the air adjacent to the fan device into the fan device through the air inlets 101 and 102 respectively on the top side and bottom side of the housing 100, and then exhaust the air through an air outlet 103 on the lateral surface of the housing 100.

Generally, the fan device is disposed in an electronic device (such as a notebook computer) or adjacent to an electronic member which is generating heat (such as a processor, a hard disk, or a chip). Thus, the purpose of heat dissipation can be achieved through the flow of the air.

As shown in FIG. 2, the housing 100 comprises an upper cover 110 and a lower cover 120. The air inlet 101 and the air inlet 102 are respectively formed on the upper cover 110 and lower cover 120. When the upper cover 110 and the lower cover 120 are assembled as the housing 100, the air outlet 103 is therefore formed on a lateral side of the housing 100, and an accommodating space is formed in the housing 100, wherein the air inlets 101 and 102 and the air outlet 103 are communicated with the accommodating space. The circuit board 200, the driving coils 400, the magnetic member 500, the rotor 600, and the blade module 700 can be accommodated in the accommodating space.

Figure 3A:
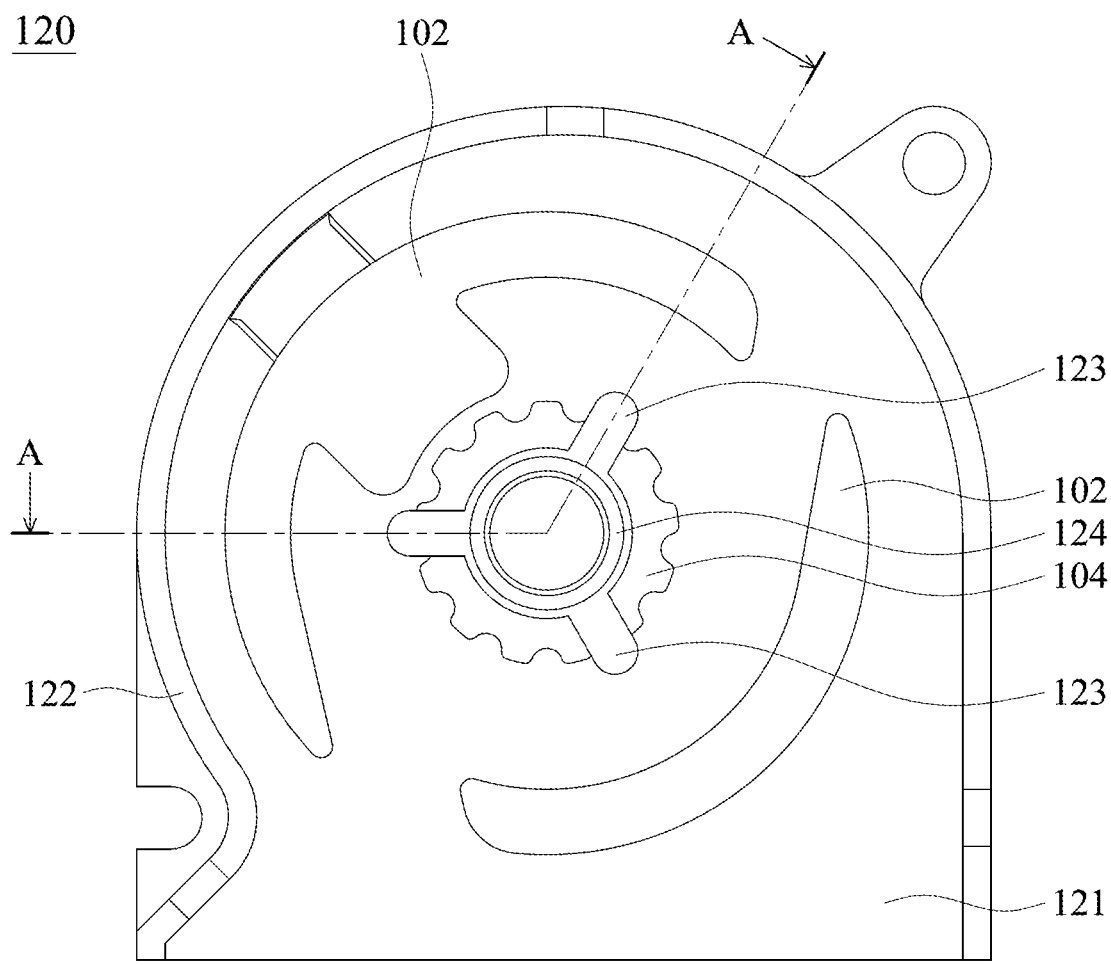
FIG. 3A is a schematic diagram of a lower cover according to an embodiment of the invention.
Figure 3B:
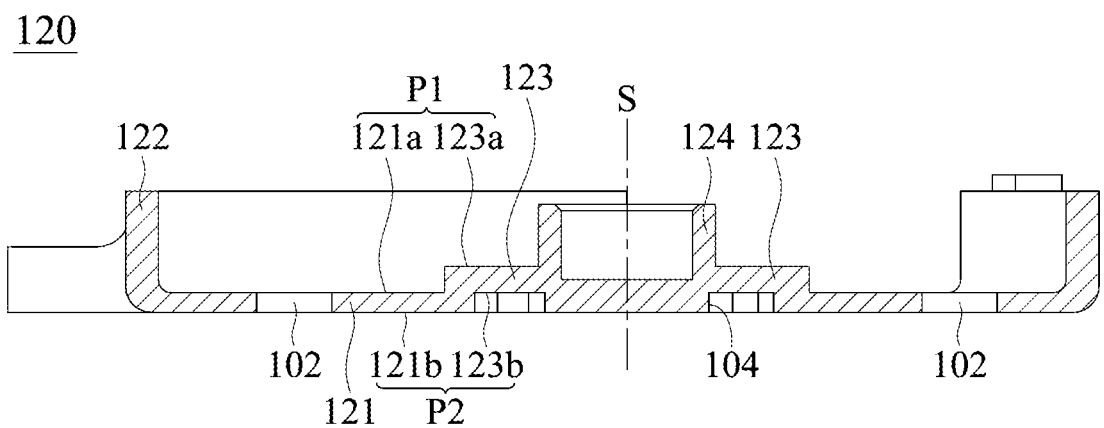
FIG. 3B is a cross-sectional view along line A-A in FIG. 3A.

FIG. 3A is a schematic diagram of a lower cover according to an embodiment of the invention, and FIG. 3B is a cross-sectional view along line A-A in FIG. 3A. As shown in FIGS. 3A and 3B, the lower cover 120 of the housing 100 comprises a bottom plate 121, a lateral wall 122, at least one bridging member 123, and a hollow protruding portion 124. The lateral wall 122 is a continuous structure connected to the bottom plate 121 and disposed on the edge of the bottom plate 121. The region without the lateral wall 122 can be defined as the air outlet 103 when the upper cover 110 and the lower cover 120 are joined together to form the housing 100. The bridging member 123 is connected between the bottom plate 121 and the hollow protruding portion 124. In this embodiment, the fan device comprises three bridging members 123.

Besides the air inlet 102, the bottom plate 121 further comprises a depression portion 104. In this embodiment, the depression portion 104 and the hollow protruding portion 124 are axial symmetric relative to the rotation axis S. A first surface P1 is defined by the top surface 121a of the bottom plate 121 and the top surfaces 123a of the bridging members 123. A second surface P2 is defined by the bottom surface 121b of the bottom plate 121 and the bottom surfaces 123b of the bridging members 123. The hollow protruding portion 124 protrudes from the first surface P1 and has a hollow structure, and the depression portion 104 is disposed on the second surface P2. It should be noted that, referring to FIG. 3B, neither the first surface P1 nor the second surface P2 is a totally horizontal flat surface. The first surface P1 and the second surface P2 are just defined for convenient description of the embodiment and other embodiments of this disclosure.

Figure 4A:
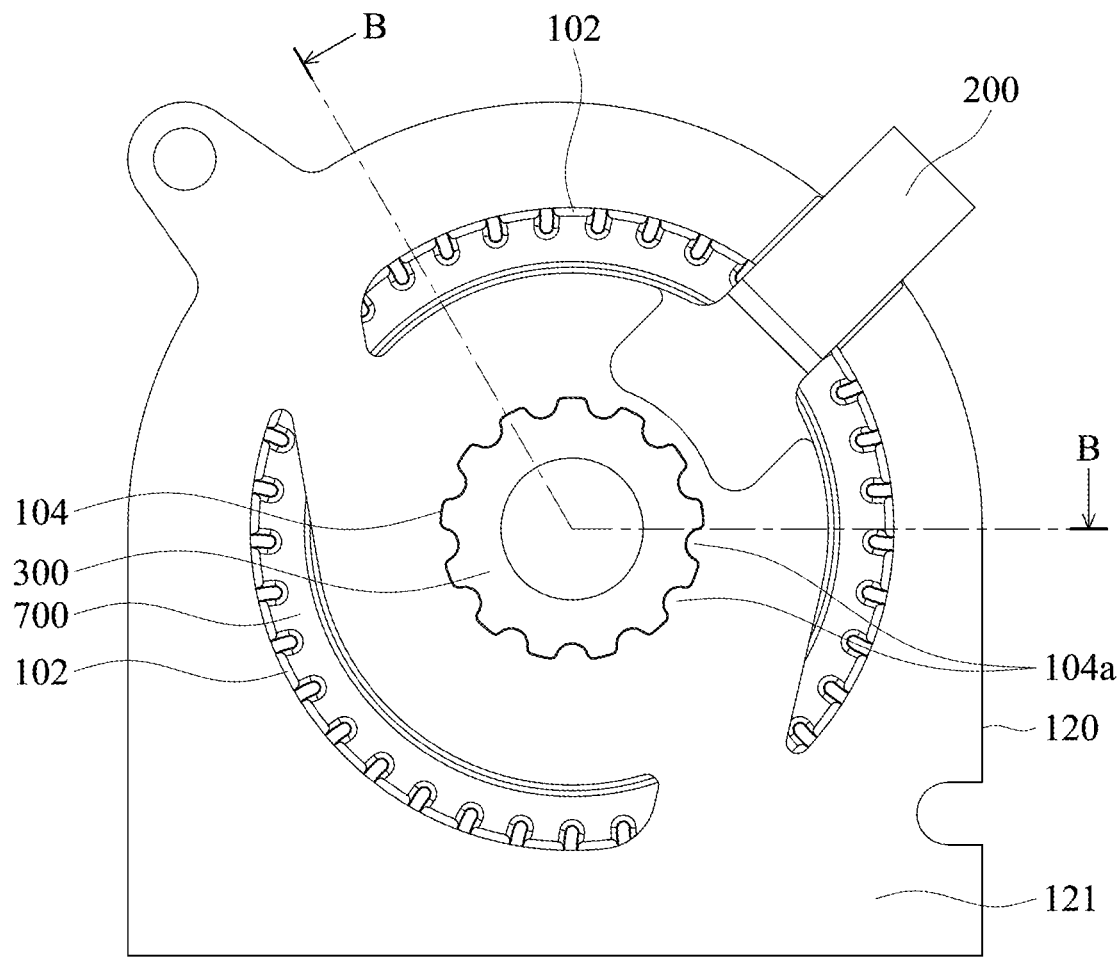
FIG. 4A is a schematic diagram of a fan device according to an embodiment of the invention.
Figure 4B:
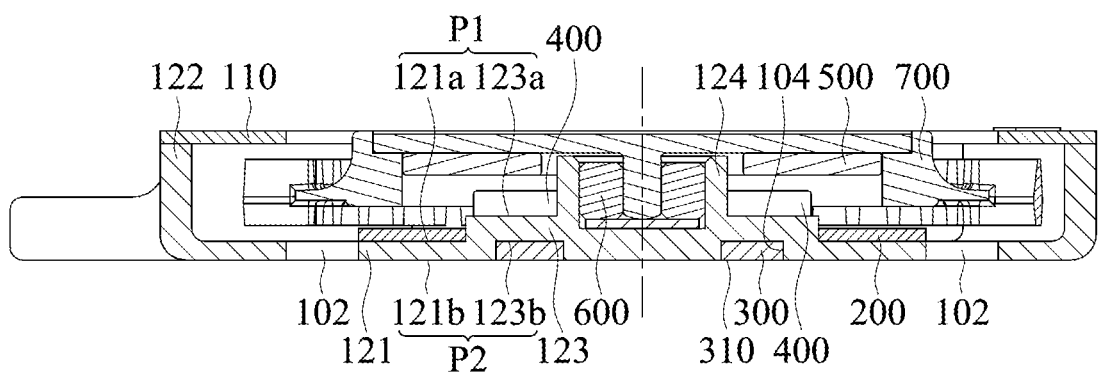
FIG. 4B is a cross-sectional view along line B-B in FIG. 4A.

FIG. 4A is a schematic diagram of a fan device according to an embodiment of the invention, and FIG. 4B is a cross-sectional view along line B-B in FIG. 4A. Referring to FIGS. 2, 4A, and 4B, when the fan device is assembled, the circuit board 200 can be accommodated in the accommodating space defined in the housing 100 and contact a portion of the bottom plate 121, and the metal member 300 can be accommodated in the depression portion 104 of the housing 100. In other words, the circuit board 200 and the metal member 300 are respectively disposed on the first surface P1 and the second surface P2 corresponds to the first surface P1.

In this embodiment, the depression portion 104 is formed on the bottom surface 121b of the bottom plate 121 and extended to the top surface 121a thereof, and the bridging members 123 do not completely cover the depression portion 104 in top view (as shown in FIG. 3A). Therefore, when the metal member 300 is disposed in the depression portion 104, a portion of the metal member, which is not covered by the bridging members 123, can be exposed from the first surface P1. Moreover, when the metal member 300 is assembled, a surface 310 of the metal member 300 can be aligned in height with the bottom surface 121b of the bottom plate 121 in lateral view (as shown in FIG. 4B). The flatness of the appearance of the fan device when assembled can be therefore achieved, and the fan device can be easily disposed or attached on the surface of the electronic member. Furthermore, as shown in FIG. 4A, the appearance of the depression portion 104 is substantially matched with the appearance of the metal member 300, such that the depression portion 104 can correspond to the metal member 300 in shape. The appearance of the depression portion 104 has a positioning structure corresponding to the appearance of the metal member 300, so as to prevent the metal member 300 from rotating when the blade module 700 rotates. For example, in this embodiment, the depression portion 104 has a plurality of continuous protrusions 104a and forms like a gear structure, the appearance of the metal member 300 corresponds to this gear structure, and the metal member 300 can be steadily positioned in the depression portion 104 and not loose therefrom.

Figure 5A:
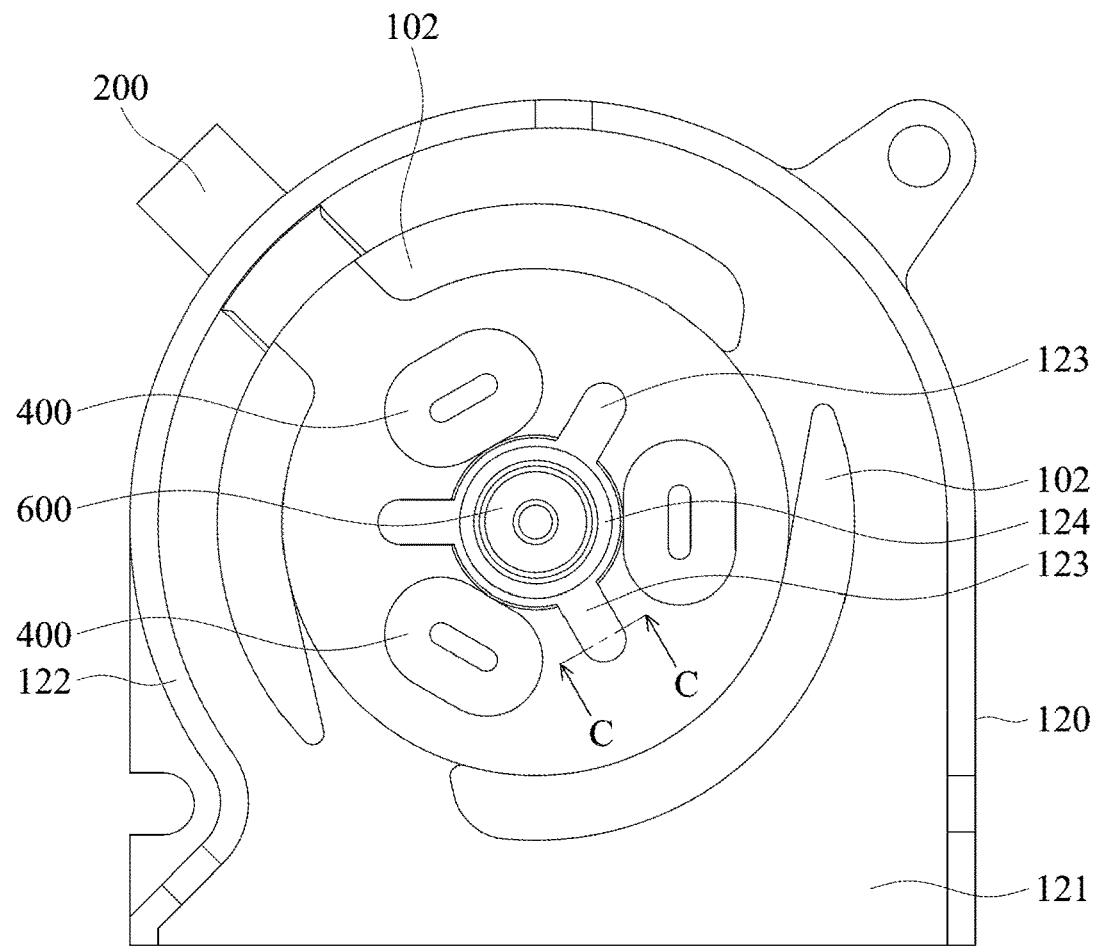
FIG. 5A is a schematic diagram of the lower cover, the circuit board, the driving coils, and the rotor according to an embodiment of the invention.

FIG. 5A is a schematic diagram of the lower cover, the circuit board, the driving coils, and the rotor according to an embodiment of the invention. As shown in FIGS. 2, 4B, and 5A, at least one recess 210 is formed on the circuit board 200, and the appearance of the recess 210 is substantially matched with the appearance of the bridging member 123. The recess 210 can correspond to the bridging member 123. Therefore, when the circuit board 200 is disposed on the lower cover 120 of the housing 100, it can surround the bridging member 123 and the hollow protruding portion 124, so as to prevent the circuit board 200 from rotating relative to the rotation axis S when the fan device operates, and the pulling and the loosening of the wires, or the collision between the wires and other members can be avoided. In this embodiment, the circuit board 200 comprises three recesses 210 which respectively corresponding to the three bridging members 123.

Figure 5B:
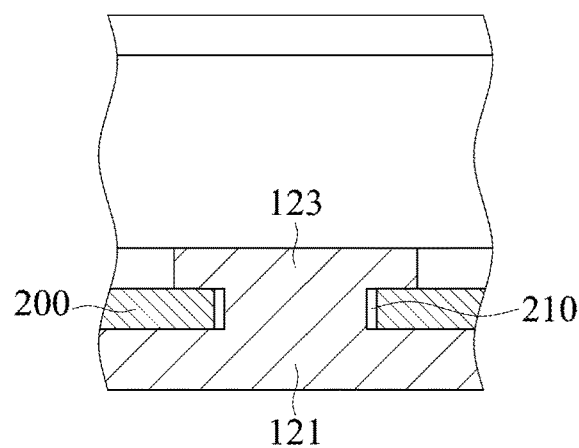
FIG. 5B is a cross-sectional view along line C-C in FIG. 5A.

It should be noted that, as shown in FIG. 5B, which is a cross-sectional view along line C-C in FIG. 5A, in addition to the arrangement of the circuit board 200, which surrounds the bridging members 123 and the hollow protruding portion 124, a portion of the circuit board 200 is further disposed between the bottom plate 121 of the housing 100 and the bridging members 123. The detachment of the circuit board 200 from the housing 100 along the rotation axis S can be avoided. Thus, the circuit board 200 can be effectively affixed to the housing 100 in both the axial direction and the radial direction by the bridging members 123.

Referring to FIGS. 4B and 5A, the rotor 600 is disposed in the hollow structure of the hollow protruding portion 124, the blade module 700 is pivotally connected to the rotor 600. The driving coils 400 and the magnetic member 500 are respectively disposed on the circuit board 200 and the blade module 700. The driving coils 400 and the magnetic member 500 are disposed corresponding to each other. When a current flows through the driving coils 400, an electromagnetic force is generated between the driving coils 400 and the magnetic member 500, and the electromagnetic force drives the blade module 700 rotating relative to the housing 100 around the rotation axis S.

In this embodiment, three driving coils 400 are disposed on the circuit board 200 at equal intervals and surround the rotor 600. The bridging members 123 are disposed between the adjacent driving coils 400. The driving coils 400 are disposed on the circuit board 200 and surround the rotor 600, preferably, they are symmetric relative to the rotor 600. The bridging members 123 are separated from each other and disposed between the driving coils 400, preferably, and they are symmetric relative to the hollow protruding portion 124.

The magnetic member 500 is disposed on the blade module 700 corresponds to the metal member 300 on the housing 100. The distance between the blade module 700 and the housing 100 in the direction of rotation axis S can be maintained by the magnetic attraction force between the magnetic member 500 and the metal member 300, and the blade module 700 can stably rotate in the accommodating space of the housing 100. Furthermore, since a portion of the metal member 300 in the embodiment is exposed from the first surface P1 of the housing 100, the magnetic attraction force is sufficient to maintain the position of the blade module 700 even though a portion of the circuit board 200 is disposed between the metal member 300 and the blade module 700.

Each of the bottom plate 121, the lateral wall 122, the bridging members 123, and the hollow protruding portion 124 can comprise metal or plastic materials, and the aforementioned members can integrally formed in one piece. Moreover, the metal member 300 can be a silicon steel sheet, for example.

Figure 6:
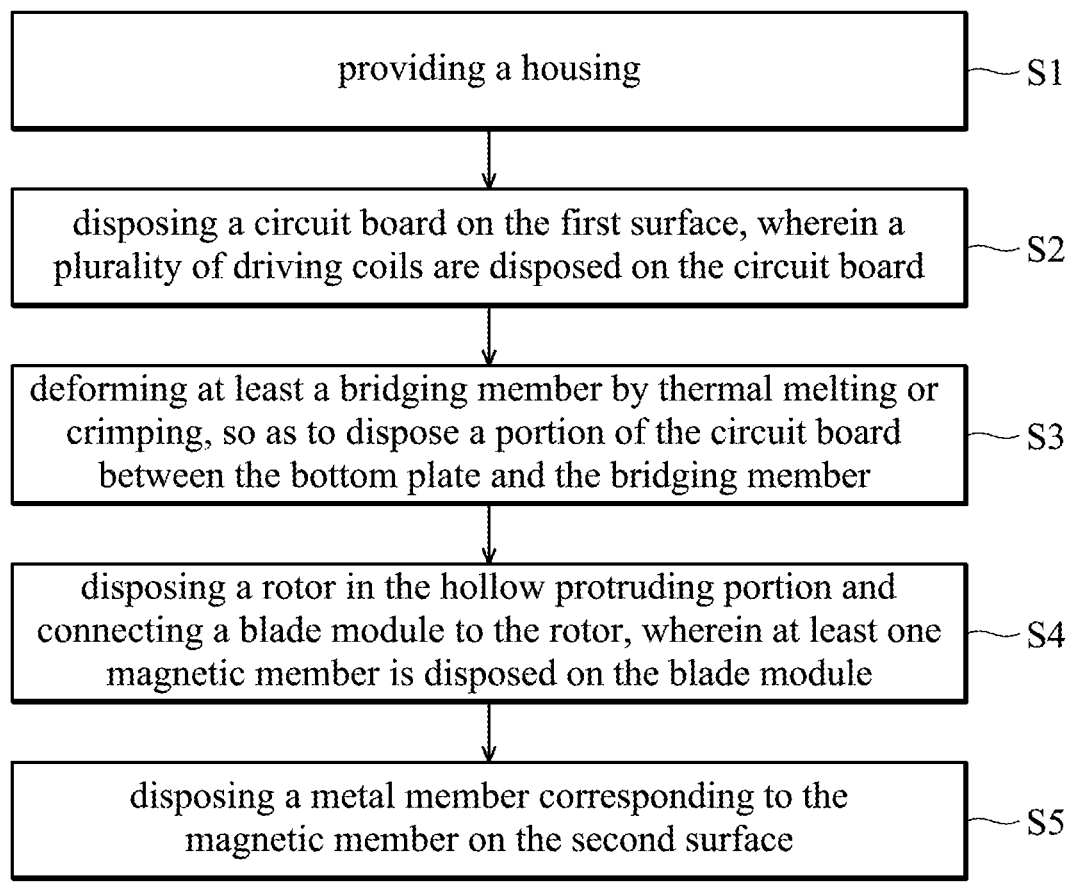
FIG. 6 is a flow chart of a method for manufacturing the fan device according to an embodiment of the invention.

FIG. 6 is a flow chart of a method for manufacturing the fan device according to an embodiment of the invention. Referring to the aforementioned figures and FIG. 6, the manufacturing method of the fan device is discussed below. First, a housing 100 can be provided (step S1), and a circuit board 200 can be disposed on a first surface P1 of the housing 100, wherein a plurality of driving coils 400 are disposed on the circuit board 200 (step S2).

Next, at least a bridging member 123 can be deformed by thermal melting or crimping, and a portion of the circuit board 200 is disposed between the bottom plate 121 of the housing 100 and the bridging member 123 (step S3). Sequentially, a rotor 600 can be disposed in a hollow protruding portion 124, and a blade module 700 can be connected to the rotor 600, wherein a magnetic member 500 is disposed on the blade module 700 (step S4).

Finally, a metal member 300 can be affixed to a second surface P2 corresponding to the first surface P1 (step S5), for example, by insert molding or a manual manner. In detail, the metal member 300 is accommodated in a depression portion 104 formed on the second surface P2 of the housing 100.

In summary, a fan device is provided. Owing to the structures of the bottom plate of the housing, the bridging member, and the hollow protruding portion, the circuit board and the metal member can respectively be affixed to the opposite surfaces of the housing without glue. Thus, the assembly time and the thickness of the fan device can be reduced, and the inclination of the members due to the glue can be completely avoided.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A fan device, comprising:
    a housing, comprising a first surface, a second surface, and a hollow protruding portion, wherein the first surface corresponds to the second surface, and the hollow protruding portion protrudes from the first surface;
    a circuit board, disposed on the first surface;
    a plurality of driving coils, disposed on the circuit board;
    at least one magnetic member, disposed corresponding to the driving coils; and
    a metal member, disposed on the second surface and corresponding to the magnetic member, wherein a portion of the metal member is exposed from the first surface.

2. The fan device as claimed in claim 1, wherein the housing further comprises a bottom plate and at least one bridging member, and the bridging member is connected between the bottom plate and the hollow protruding portion.

3. The fan device as claimed in claim 2, wherein the housing further comprises a depression portion formed on the bottom plate, and the metal member is disposed in the depression portion.

4. The fan device as claimed in claim 3, wherein the appearance of the depression portion corresponds to the appearance of the metal member.

5. The fan device as claimed in claim 3, wherein the depression portion has a positioning structure corresponding to the metal member.

6. The fan device as claimed in claim 3, wherein a surface of the metal member is aligned with a bottom surface of the bottom plate.

7. The fan device as claimed in claim 2, wherein the circuit board surrounds the bridging member and the hollow protruding portion.

8. The fan device as claimed in claim 7, wherein the circuit board has at least one recess, and the appearance of the recess corresponds to the appearance of the bridging member.

9. The fan device as claimed in claim 7, wherein the bridging member is disposed between the driving coils.

10. The fan device as claimed in claim 2, wherein the bottom plate, the bridging member, and the hollow protruding portion are integrally formed in one piece.

11. The fan device as claimed in claim 1, wherein the driving coils are arranged at equal intervals.

12. The fan device as claimed in claim 1, further comprising:
    a rotor, disposed in the hollow protruding portion; and
    a blade module, connected to the rotor, wherein the magnetic member is disposed on the blade module.

13. The fan device as claimed in claim 12, wherein a portion of the circuit board is disposed between the metal member and the blade module.

14. A fan device, comprising:
    a housing, comprising a first surface, a second surface, a hollow protruding portion, a bottom plate, and at least one bridging member, wherein the first surface corresponds to the second surface, the hollow protruding portion protrudes from the first surface, and the bridging member is connected between the bottom plate and the hollow protruding portion;
    a circuit board, disposed on the first surface;
    a plurality of driving coils, disposed on the circuit board;
    at least one magnetic member, disposed corresponding to the driving coils; and
    a metal member, disposed on the second surface and corresponding to the magnetic member, wherein a portion of the circuit board is disposed between the bottom plate and the bridging member.

15. A method for manufacturing a fan device, comprising steps of:
    providing a housing, wherein the housing comprises a first surface, a second surface, and a hollow protruding portion, the first surface corresponds to the second surface, and the hollow protruding portion protrudes from the first surface;
    disposing a circuit board on the first surface, wherein a plurality of driving coils are disposed on the circuit board;
    disposing at least one magnetic member corresponding to the driving coils; and
    disposing a metal member corresponding to the magnetic member on the second surface, wherein a portion of the metal member is exposed from the first surface.

16. The method as claimed in claim 15, wherein the housing further comprises a bottom plate and at least one bridging member, and the bridging member is connected between the bottom plate and the hollow protruding portion.

17. The method as claimed in claim 16, wherein the housing further comprises a depression portion formed on the bottom plate, and the metal member is disposed in the depression portion.

18. The method as claimed in claim 16, further comprising a step of:
    deforming the bridging member by thermal melting or crimping after the step of disposing the circuit board on the first surface, so as to dispose a portion of the circuit board between the bottom plate and the bridging member.

19. The method as claimed in claim 15, wherein the metal member is disposed on the second surface by insert molding.

20. The method as claimed in claim 15, wherein the step of disposing the magnetic member corresponding to the driving coils comprises steps of:
    disposing a rotor in the hollow protruding portion; and
    connecting a blade module to the rotor, wherein the magnetic member is disposed on the blade module.

* * * * *